United States Patent
Seth et al.

(10) Patent No.: US 7,332,965 B2
(45) Date of Patent: Feb. 19, 2008

(54) GATE LEAKAGE INSENSITIVE CURRENT MIRROR CIRCUIT

(75) Inventors: Sumantra Seth, Karnataka (IN); Somasunder Kattepura Sreenath, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 11/379,236

(22) Filed: Apr. 19, 2006

(65) Prior Publication Data

US 2007/0247230 A1    Oct. 25, 2007

(51) Int. Cl.
*H03F 3/04* (2006.01)
(52) U.S. Cl. .................. 330/288; 330/296; 330/253
(58) Field of Classification Search ................ 330/288, 330/296, 253
See application file for complete search history.

(56) References Cited

U.S. PATENT DOCUMENTS

| | | | | |
|---|---|---|---|---|
| 4,064,506 A | * | 12/1977 | Cartwright, Jr. ............ 341/135 |
| 4,216,394 A | * | 8/1980 | Leidich ....................... 327/540 |
| 4,250,461 A | * | 2/1981 | Limberg ...................... 330/288 |
| RE31,263 E | * | 5/1983 | Schade, Jr. .................. 330/288 |
| 4,450,414 A | * | 5/1984 | Patterson, III .............. 330/288 |
| 4,467,191 A | * | 8/1984 | Chalfin et al. ........... 250/214 A |
| 5,359,296 A | * | 10/1994 | Brooks et al. .............. 330/288 |

* cited by examiner

*Primary Examiner*—Patricia Nguyen
(74) *Attorney, Agent, or Firm*—William B Kempler; W. James Brady, III; Frederick J. Telecky, Jr.

(57) ABSTRACT

A gate leakage insensitive current mirror circuit including an input stage, an output stage, and a pair of complementary source followers. The pair of complementary source followers is connected between the input stage and the output stage. In operation, the input stage receives an input current and the pair of complementary source followers receives a first current source and a second current source. The output stage then provides an output current. The complementary source followers form a negative feedback loop and establish a bias voltage for the input stage and the output stage as a function of the input current that is independent of gate leakage between the input stage and the output stage.

27 Claims, 3 Drawing Sheets

US 7,332,965 B2

GATE LEAKAGE INSENSITIVE CURRENT MIRROR CIRCUIT

TECHNICAL FIELD OF THE INVENTION

The present invention relates generally to integrated circuits, and more particularly relates to current mirror circuits.

BACKGROUND OF THE INVENTION

Current mirrors are often used in analog circuits to generate an output current proportional to an input current. The proportionality constant of the output and input current in current mirrors is commonly known as mirroring ratio. Generally, a simplest current mirror circuit can be realized only through employing two MOS (Metal Oxide Semiconductor) transistors. As CMOS (Complementary MOS) technology progresses into ultra deep submicron (UDSM) era, the MOS transistor dimensions are getting aggressively scaled down. In the present day, 90/65 nm, CMOS technology, due to the very thin gate oxide thickness, the MOS input impedance is no longer only capacitive. The gate impedance now has a dominant resistive component, which can be attributed to gate leakage. Generally, in a Bipolar Junction Transistor, the base current determines the collector current, but in the case of a MOS transistor the drain current is not determined by the gate current as MOS transistors could be broadly modeled as a voltage-controlled current source. In such an instance, one of the basic analog circuits that gets affected during operation is the current mirror. In MOS circuits, a simple diode connected transistor normally behaves as a very good current mirror. In such a simple current mirror circuit gate-leakage can lead to an error in the output current that is proportional to the mirroring ratio. It is often desired that the current mirror has a good accuracy with a small voltage across the current mirror, commonly referred as headroom. Generally, the short channel MOS transistor has lower output impedance resulting in mirroring error due to difference in the drain voltages of the diode and mirror transistors. The mirroring error due to the lower output impedance of the transistor is known as systematic error.

To overcome this problem, a conventional cascoding method employs four MOS transistors to complete the current mirror circuit. The cascoded current sources in this conventional method require more headroom when compared to the simple two transistor mirroring technique. These architectures minimize the systematic error. But most of the conventional cascoded current mirrors or simple MOS diode current mirrors suffer from large errors in the output current if there is significant gate leakage. Other conventional techniques use either an amplifier or a source follower between the mirroring transistors, which can also be used to address gate leakage problem. However, using the source follower, even though results in being gate leakage insensitive it still requires significant input headroom. There are other conventional techniques that use feedback amplifiers which require more area and power.

SUMMARY OF THE INVENTION

According to an aspect of the subject matter, there is provided a current mirror circuit that includes an input stage to receive an input current and an output stage that provides an output current. Further, the current mirror circuit includes a pair of complementary source followers that are connected between the input stage and the output stage. The pair of complementary source followers receives a first current source and a second current source and establishes a bias voltage for the input stage and the output stage as a function of the input current that is independent of gate leakage of the input stage and the output stage. This enables the output current to be proportional to the input current and independent of the gate leakage.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
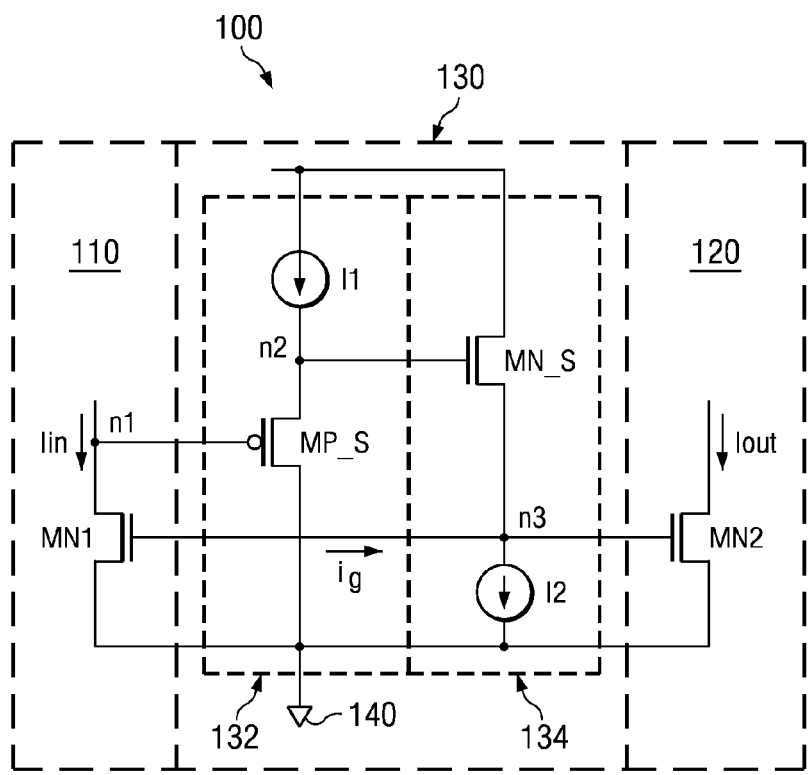
FIG. 1 is a schematic diagram of a gate leakage insensitive current mirror circuit according to an embodiment of the present invention.

Referring now to FIG. 1, there is illustrated an example embodiment of a current mirror circuit 100 that is insensitive to gate leakage. As shown in FIG. 1, the current mirror circuit 100 includes an input stage 110, an output stage 120, and a pair of complementary source followers 130. Further as shown in FIG. 1, the input stage 110 includes a first node n1 and first mirror transistor MN1. The first mirror transistor MN1 includes a source electrode, a gate electrode, and a drain electrode. The drain electrode of the first mirror transistor MN1 is connected to the first node n1.

Further as shown in FIG. 1, the pair of complementary source followers 130 includes a PMOS source follower 132 and an NMOS source follower 134. Further as shown in FIG. 1, the PMOS source follower 132 includes a second node n2 and a PMOS transistor MP_S. The PMOS transistor MP_S includes a source electrode, a gate electrode, and a drain electrode. The NMOS source follower 134 includes an NMOS transistor MN_S and a third node n3. The NMOS transistor MN_S includes a source electrode, a gate electrode, and a drain electrode. Also as shown in FIG. 1, the output stage 120 includes a second mirror transistor MN2, which is an NMOS transistor that includes a source electrode, a gate electrode, and a drain electrode.

As shown in FIG. 1, the node n1 is connected to the drain of the first mirror transistor MN1. In addition, the node n1 is also connected to receive input current Iin. Further as shown in FIG. 1, the node n2 is connected to source of the PMOS transistor MP_S. The node n2 is connected to receive the first current source I1. Also as shown in FIG. 1, the node n1 is connected to the gate of the PMOS transistor MP_S. Further, the drain of the PMOS transistor is connected to a ground terminal 140. Furthermore as shown in FIG. 1, the drain of the NMOS transistor MN_S is coupled to a supply voltage. The gate of the NMOS transistor MN_S is connected to node n2 and the source of the NMOS transistor MN_S is connected to a second current source I2 via node n3. Also, as shown in FIG. 1, the drain of the second mirror transistor MN2 is connected to provide an output current Iout. The gate of the second mirror transistor MN2 is connected to node n3. The source of the second mirror transistor MN2 is connected to the ground terminal 140.

In operation, the current mirror circuit 100 described above receives the input current Iin via node n1 and provides the output current Iout. Further, the PMOS source follower 132 receives a first current source I2 and the NMOS source follower 134 receives a second current source I2 and establishes a bias voltage that is independent of gate leakage between the input stage 110 and the output stage 120. The gate leakage at node n3, referred as $i_g$, is provided by the NMOS source follower 134, hence the gate voltage node n3 is independent of the gate leakage. (The same is applicable when both the first and second mirror transistors MN1 and MN2 are PMOS based transistors as described above except that the order of complementary source follower will be reverse and the direction of input current and output current will also be reverse).

The current mirror circuit 100 shown in FIG. 1 is gate leakage insensitive and requires only small input headroom. In the embodiment shown in FIG. 1, the input headroom required for the current mirror circuit 100 is reduced by using the pair of complementary source followers 130 that includes the PMOS source follower 132. As shown in FIG. 1, the PMOS transistor MP_S provides the extra headroom for the input current source Iin, by subtracting $VT_{Tp}+V_{on\_p}$ (wherein $V_{Tp}$ and $V_{on\_p}$ are the threshold voltage and the overdrive voltage of the PMOS transistor MP_S, respectively) from node n2 biased at $V_{Tm}+V_{Ts}+V_{onm}+V_{ons}$. Wherein the $V_{Tm}$, $V_{Ts}$, $V_{onm}$, and $V_{ons}$ are the threshold voltages and overdrive voltages of the second current mirror transistor MN2 (in these embodiments, the threshold and overdrive voltages of the first and second mirror transistors MN1 and MN2 are same) and the NMOS source follower transistor MN_S, respectively). If there is a $V_T$ relationship between the PMOS transistor MP_S and the NMOS transistor MN_S then the sum of voltages $(V_{Ts}+V_{ons}+V_{Tm})$ can be cancelled by the sum of voltages $(V_{Tp}+V_{on\_p})$. In general, the total cancellation does not hold across all process corners, and the input headroom requirement increases compared to the calculated limit of $V_{onm}$ by the difference between $(V_{Ts}+V_{ons}+V_{Tm})$ and $(V_{Tp}+V_{on\_p})$.

Figure 2:
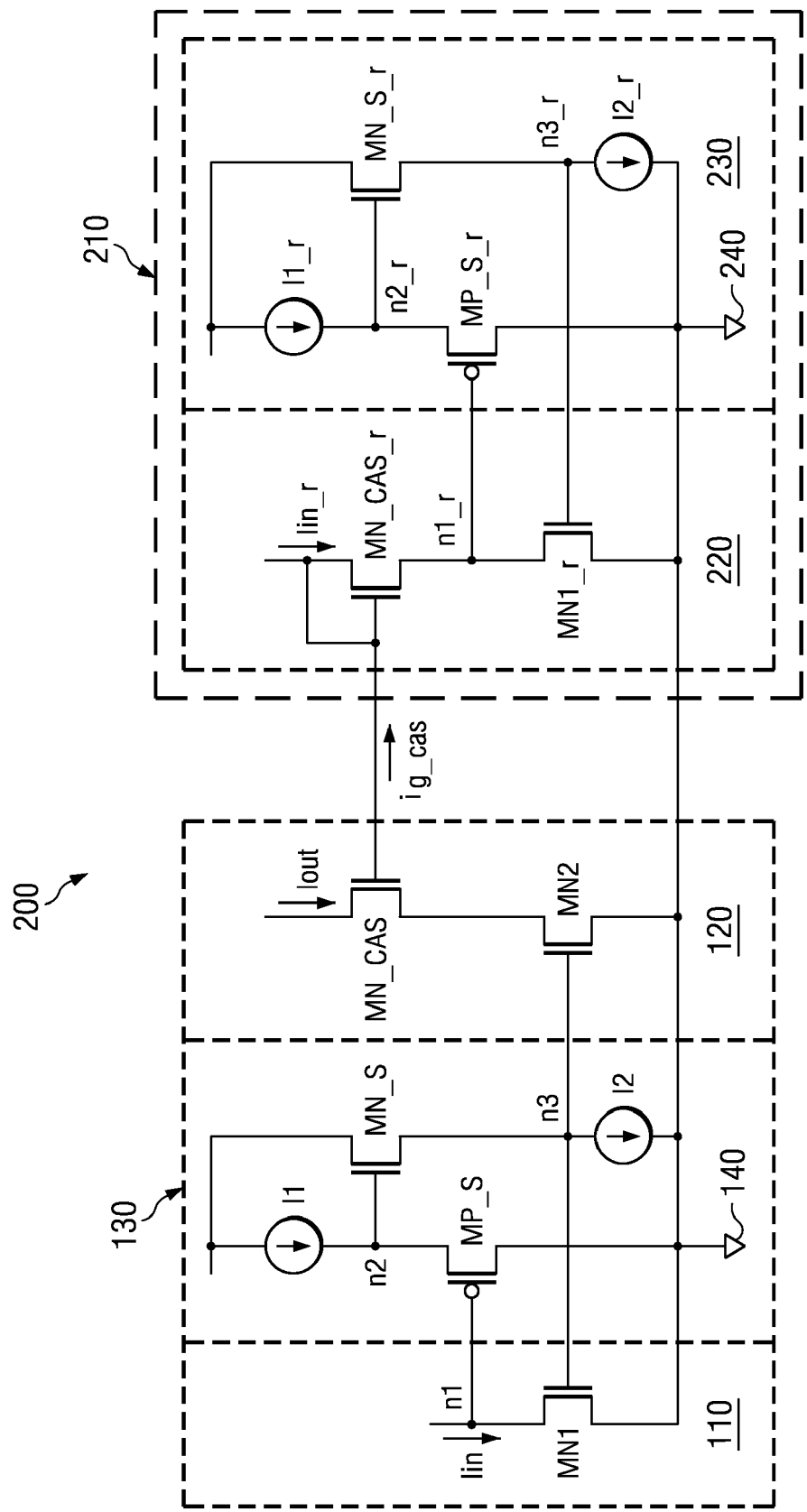
FIG. 2 is a schematic diagram of a gate leakage insensitive cascoded current mirror circuit according to an embodiment of the present invention.

Referring now to FIG. 2, there is illustrated an example embodiment of a gate leakage insensitive cascoded current mirror circuit 200. The cascoded current mirror circuit 200 shown in FIG. 2 biases an output cascode for the current mirror circuit shown in FIG. 1. The cascoded current mirror circuit 200 is similar to the current mirror circuit 100 shown in FIG. 1, except that the output stage includes a second NMOS transistor MN_CAS that is connected to the second mirror transistor MN2. In addition, the cascoded current mirror circuit 200 includes a replica circuit 210 that generates the bias for the second NMOS transistor MN_CAS.

As shown in FIG. 2, the replica circuit 210 includes an input stage 220 connected to a pair of complementary source followers 230 that is similar to the input stage 110 and the pair of complementary source followers 130 shown in FIG. 1, except that in the input stage 220 further a second NMOS transistor MN_CAS_r connected to the first mirror transistor MN1_r. The second NMOS transistor MN_CAS associated with the output stage 120 includes a source electrode, a gate electrode, and a drain electrode. Further, the second NMOS transistor MN_CAS_r associated with the input stage 220 of the replica circuit 210 includes a source electrode, a gate electrode, and a drain electrode.

As shown in FIG. 2, the source electrode of the second NMOS transistor MN_CAS is connected to the drain electrode of the second mirror transistor MN2. The drain electrode of the NMOS transistor MN_CAS is connected to provide an output current Iout. The drain electrode of the second NMOS transistor MN_CAS_r associated with the input stage 220 of the replica circuit 210 is connected to receive an input current Iin_r. Further the source electrode of the second NMOS transistor MN_CAS_r is connected to the first mirror transistor MN1_r associated with the replica circuit 210. Also as shown in FIG. 2, the gate electrode of the second NMOS transistor MN_CAS is connected to the gate electrode of the second NMOS transistor MN_CAS_r associated with the replica circuit 210. In addition as shown in FIG. 2, drain electrode of the second NMOS transistor MN_CAS_r is connected to the gate electrode of the second NMOS transistor MN_CAS_r.

The cascoded current mirror circuit 200 shown in FIG. 2 biases an output cascode of the current mirror circuit 100 shown in FIG. 1, by using the replica circuit 210. As shown in FIG. 2, the replica circuit 210 biases the voltage at n1_r node to be the same voltage as in node n1. The MN_CAS_r biases the cascode. As a result, the drain voltages of the first and second mirror transistors MN1 and MN2 can be substantially closer to each other thereby minimizing the systematic mirroring error. The difference in the drain voltages is due to mismatches between the replica circuit 210 and the primary biasing stage 130, the gate leakage of the cascoded second NMOS transistor MN_CAS_r, and the difference in the leakage current between the replica circuit 210 and the primary biasing stage 130. The current sources used in the source followers, I1, I2, I1_r and I2_r, need not be substantially close to each other. The output headroom of this current source is $((V_{Tm}+V_{Ts}+V_{onm}+V_{ons})-(V_{Tp}+V_{on\_p}))+V_{on\_cas}$. With proper design of MP_S, we can compensate for $(V_{Tm}+V_{Ts})$ using $(V_{Tp}+V_{on\_p})$. The input headroom of the circuit shown in FIG. 2 can be higher than a desired value Of $(V_{onm})$, which can be by an amount equal to the error in cancellation provided by the PMOS source follower 132. The output headroom of the cascoded current mirror circuit 200 can be higher than the input headroom by the overdrive voltage $(V_{on\_cas})$ of the cascode. The replica bias tracks the process variation of the first mirror transistor MN1 and MN_CAS, hence enabling optimization of bias margins. Also the replica circuit 210 can be made small by scaling it compared to the primary biasing stage 130.

The cascoded current mirror circuit 200 shown in FIG. 2 reduces the systematic mirroring error without using the input cascode and without increasing the input headroom requirement as compared to the current mirror circuit 100 shown in FIG. 1. In addition, the cascoded current mirror circuit 200 improves output impedances by an output cascode.

Figure 3:
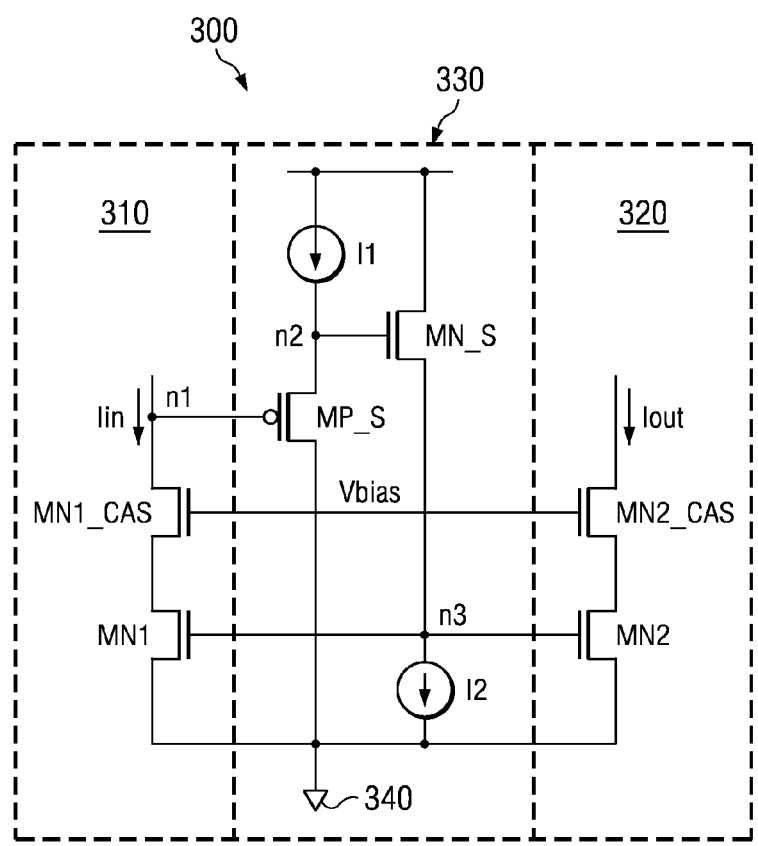
FIG. 3 is a schematic diagram of another cascoded gate leakage insensitive current mirror according to an embodiment of the present invention.

Referring now to FIG. 3, there is illustrated an example embodiment of a gate leakage insensitive current mirror with a cascode biasing circuit 300. The cascode biasing circuit 300 shown in FIG. 3 is similar to the current mirror circuit 100 shown in FIG. 1 except that the input stage has a first pair of mirror transistors and the output stage has a second pair of mirror transistors. As shown in FIG. 3, the first pair of mirror transistors includes a first input mirror transistor MN1_CAS and a first mirror transistor MN1. The second pair of mirror transistors includes a first output mirror transistor MN2_CAS and a second mirror transistor MN2.

Each of the first input mirror transistor MN1_CAS, the first mirror transistor MN1, the first output mirror transistor MN2_CAS, and the second mirror transistor MN2 includes a source electrode, a gate electrode, and a drain electrode. As shown in FIG. 3, node n1 is connected to the drain electrode of the first input mirror transistor MN1_CAS. The source electrode of the first input mirror transistor MN1_CAS is connected to the drain electrode of the first mirror transistor MN1. The gate electrode of the first input mirror transistor MN1_CAS is connected to the gate electrode of the first output mirror transistor MN2_CAS. Furthermore, the drain electrode of the first output mirror transistor MN2_CAS is connected to provide an output current Iout.

In the cascode biasing circuit 300 shown in FIG. 3, if $V_{Tp}+V_{on\_p}$, compensates $V_{TS}+V_{ons}$, then the input headroom is comparable to high swing cascode, and the output headroom, dependent on Vbias, can be as low as the sum of overdrive voltages of the second mirror transistor MN2 and the first output mirror transistor MN2_CAS. The cascode biasing circuit 300 shown in FIG. 3 can be used as a generic current mirror circuit in any CMOS process having a high gate leakage.

Figure 4:
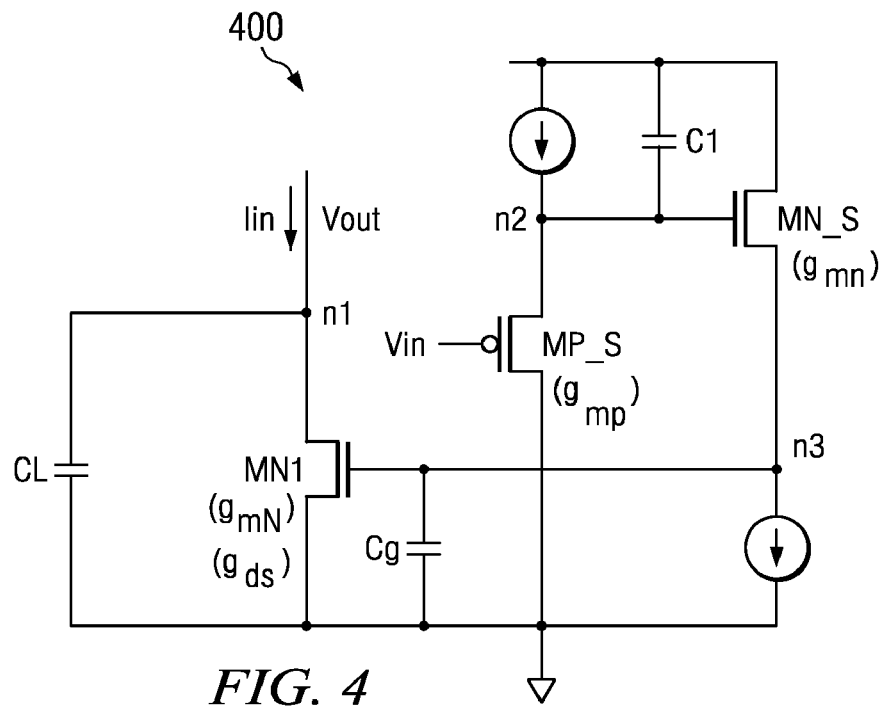
FIGS. 4 and 5 are schematic diagrams illustrating compensation of the current source according to an embodiment of the present invention for the current mirror circuits, such as those shown in FIGS. 1-3.
Figure 5:
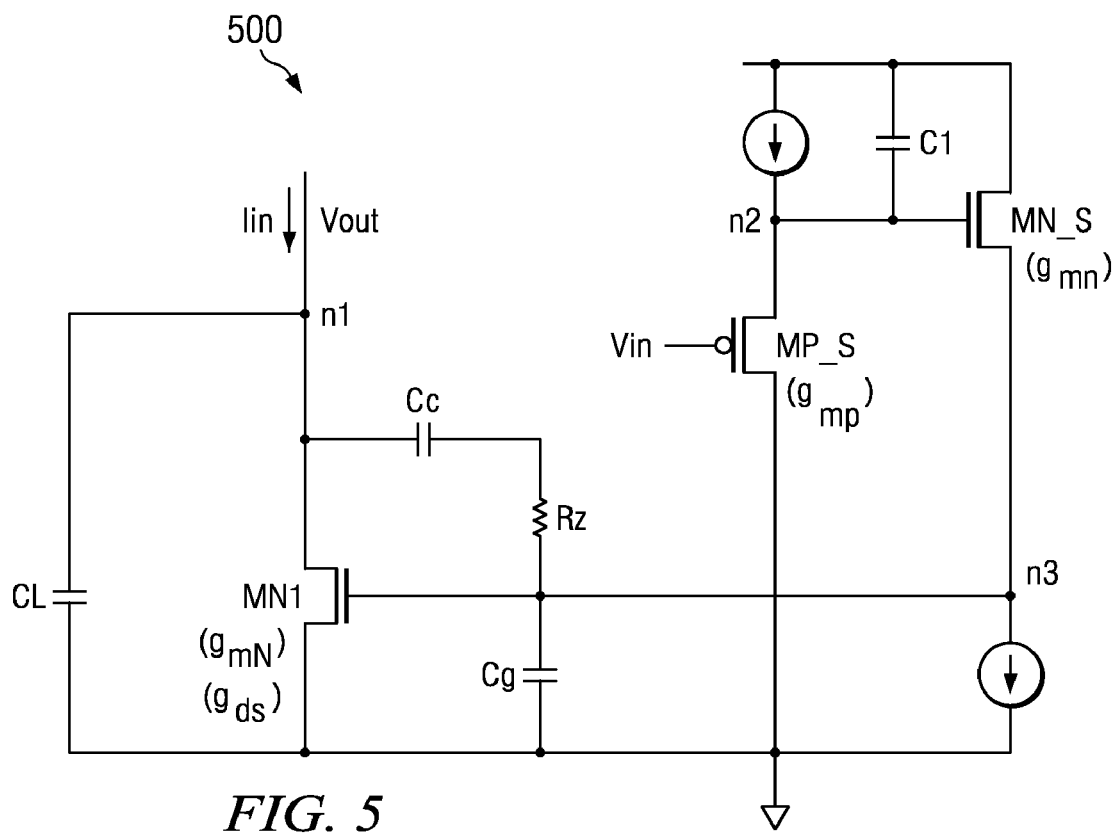

Referring now to FIGS. 4 and 5 there is illustrated embodiments compensation of the current for the current mirror circuits shown in the FIGS. 1-3. The gate leakage correction circuits shown in FIGS. 1 and 3 have three stages, input stage, a pair of complementary source follower stage, and an output stage. If the trans-conductance, $g_m$, of MN_S is made small, node n3 can give a moderately high impedance node making miller compensation effective. A decoupling capacitance can be inserted on node n3 to reduce the effect of ground noise, without affecting the stability. The detailed stability analysis of the current mirror circuits shown in FIGS. 1-3 is not included in this disclosure as they are very well known in the relevant art. Performing a small signal analysis of the circuit shown in FIG. 4, yields a loop gain as given below by equation (2).

$$A \cdot \beta = -\frac{g_{mN}}{(sC_L + g_{ds})} \times \frac{g_{mn}g_{mp}}{(sC_g + g_{mn}) \times (sC_1 + g_{mp})} \quad (2)$$

The below equation (3) provides the loop gain after adding the miller compensation as shown in FIG. 5.

$$A \cdot \beta = -\frac{\frac{g_{mN}}{g_{ds}} g_{mp}(1 + C_c(R_Z - 1/g_{mN}))}{\left(1 + \frac{R_z C_c C_L s^3}{g_{mn}g_{ds}} + s^2 \left[\frac{C_L C_g + C_c C_L + C_c C_g}{g_{mn}g_{ds}} + \frac{R_z C_c(g_{mN} C_c + g_{mn} C_L + g_{ds} C_g)}{g_{mn}g_{ds}}\right] + s\left(\frac{g_{mN} C_c}{g_{ds}g_{mn}} + \frac{C_g}{g_{mn}}\right)\right)(sC_1 + g_{mp})} \quad (3)$$

In the case of current mirrors, $C_L$ (load cap) is smaller compared to $C_g$ (gate cap +decoupling cap). We have assumed $C_{g>>CL}$. The poles and zeroes are as given in the below equation. (4).

$$p1 = -\frac{g_{mn}g_{ds}}{g_{mN}C_c},\ p2 = -\frac{g_{mN}}{(C_g + C_L)},\ p3 = -\frac{(C_L + C_g)}{R_z C_L C_g}, \quad (4)$$

$$p4 = -\frac{g_{mp}}{C_1},\ z1 = -\frac{1}{C_c\left(R_z - \frac{1}{g_{mN}}\right)}$$

It can be seen from the above equations that, Rz needs to be greater than $1/g_{mN}$ so that the zero is in the left half plane. The below equation (5a) shows the relation to ensure p2>2UGB(~$g_{mn}$/Cc) for having phase margin greater than 60°. The parameters z1, p3 and p4 need to be ensured to be outside the parameter UGB. In such a case C1 can be small, and hence p4 can be easily kept outside the parameter UGB. In order to satisfy above conditions and to have z1 before p3, Rz follows below equation 5(b).

$$\frac{1}{g_{mn}} > \frac{2}{g_{mN}}\left(\frac{C_g}{C_c}\right) \quad 5a$$

$$\frac{1}{g_{mN}}\left(1 + \frac{C_L}{C_c}\right) < R_z < \left(\frac{1}{g_{mn}} + \frac{1}{g_{mN}}\right) \quad 5b$$

The same analysis can hold good for circuitry shown in FIG. 3. Replacing $g_{ds}$ by $(g_{ds} \cdot g_{ds2})/g_{m2}$, where $g_{m2\ and}\ g_{ds2}$ are trans-conductance and output conductance of MN_CAS.

In some embodiments, the first mirror transistor and the second mirror transistor shown in FIG. 1 are PMOS transistors. Also in these embodiments, the pair of complementary source followers 130 includes a PMOS source follower 134 and a NMOS source follower 132. Further in these embodiments, the PMOS source follower 134 includes a third node n3 and a PMOS transistor MN_S. The PMOS transistor MN_S includes a source electrode, a gate electrode, and a drain electrode. Furthermore in these embodiments, the NMOS source follower 132 includes a NMOS transistor MP_S and a second node n2. The NMOS transistor MP_S includes a source electrode, a gate electrode, and a drain electrode. It can be envisioned that in these embodiments, the direction of currents Iin and Iout shown in FIG. 1 are reversed and the supply voltage and the ground terminal 140 are also interchanged.

The above-described methods and apparatus provide various schemes to provide a gate leakage insensitive current mirror circuitry. The above-described methods and apparatus use pair of complementary source followers to reduce the input headroom requirement of the current mirror circuits. The above-described circuits can use miller compensation to help reduce the capacitance for compensation. The decoupling capacitance to ground can also be added from the mirroring gate node to reduce the ground noise effect without affecting stability of the current mirror circuitry. The above-described circuits are described using NMOS based current mirror circuits, but they are equally applicable for PMOS based current mirror circuits. Further, the impact on the silicon area requirement due to the addition of the above described gate leakage tolerant schemes is significantly lower.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-5 are merely representational and are not drawn to scale. Certain proportions thereof may be exaggerated, while others may be minimized. FIGS. 1-5 illustrate various embodiments of the invention that can be understood and appropriately carried out by those of ordinary skill in the art. It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The invention claimed is:

1. A circuit comprising:
   an input stage that receives an input current;
   an output stage that provides an output current; and
   a pair of complementary source followers connected between the input stage and the output stage receives a first current source and a second current source, respectively, and establishes a bias voltage for the input stage and the output stage as a function of the input current that is independent of gate leakage of the input stage and the output stage.

2. The circuit of claim 1, wherein the pair of complimentary source followers comprises;
   a PMOS source follower; and
   an NMOS source follower connected to the PMOS source follower, wherein the PMOS source follower is connected to the input stage, and wherein the NMOS source follower is connected to the input stage and the output stage.

3. The circuit of claim 2, wherein the input stage comprises:
   a first node to connect to receive the input current; and
   a first mirror transistor having a source electrode, a gate electrode, and a drain electrode and wherein the drain electrode of the first mirror transistor is connected to the first node.

4. The circuit of claim 3, wherein the PMOS source follower comprises:
   a second node to connect to receive the first current source; and
   a PMOS transistor having a source electrode, a gate electrode, and a drain electrode, wherein the source electrode of the PMOS transistor is connected to the second node, the gate electrode is connected the first node, and the drain electrode of the PMOS transistor is connected to a ground terminal.

5. The circuit of claim 4, wherein the NMOS source follower comprises:
   a third node; and
   an NMOS transistor having a source electrode, a gate electrode, and a drain electrode, wherein the source electrode of the NMOS transistor to connect to the second current source, wherein the gate electrode of the NMOS transistor is connected to the second node, wherein the source of the NMOS transistor is connected to the third node, and wherein the third node is connected to the gate electrode of the first mirror transistor, wherein the third node to connect to the ground terminal via the second current source, and the drain of the NMOS transistor is to couple to a supply voltage.

6. The circuit of claim 5, wherein the output stage comprises:
   a second mirror transistor having a source electrode, a gate electrode, and a drain electrode, wherein the drain electrode of the second mirror transistor to couple to provide an output current, wherein the gate electrode of the second mirror transistor is connected to the third node, and wherein the source electrode of the second mirror transistor is connected to the ground terminal.

7. The circuit of claim 6, wherein the first mirror transistor and the second mirror transistor are NMOS transistors.

8. The circuit of claim 1, wherein the pair of complementary source followers comprises:
   an NMOS source follower; and
   a PMOS complimentary source follower connected to the NMOS source follower, wherein the NMOS source follower is connected to the input stage, and wherein the PMOS source follower is connected to the input stage and the output stage.

9. The circuit of claim 8, wherein the input stage comprises:
   a first mirror transistor having a source electrode, a gate electrode, and a drain electrode and wherein the drain electrode is connected to a first node and an input source current.

10. The circuit of claim 9, wherein the output stage comprises:
    a second mirror transistor having a source electrode, a gate electrode, and a drain electrode, wherein the drain electrode of the second mirror transistor to couple to provide an output current, wherein the gate electrode of the second mirror transistor is connected to the third node, and wherein the source electrode of the second mirror transistor is connected to the ground terminal.

11. The circuit of claim 10, wherein the first mirror transistor and the second mirror transistor are PMOS transistors.

12. A current mirror cascode biasing circuit comprising:
    a primary biasing stage, wherein the primary biasing stage comprises:
       an input stage that receives an input current;
       an output stage that provides an output current;
       a pair of complementary source followers that is connected between the input stage and the output stage receives a first current source and a second current source, respectively, and provides a gate leakage current to both the input and output stage as a function of the input current; and a replica circuit connected to the output stage to bias the output stage as a function of the primary biasing stage.

13. The circuit of claim 12, wherein the pair of complementary source followers comprises:
   a PMOS source follower; and
   an NMOS source follower connected to the PMOS source follower, wherein the PMOS source follower is connected to the input stage and the NMOS source follower is connected to the output stage.

14. The circuit of claim 13, wherein the input stage comprises:
   a first node to connect to receive the input current; and
   a first mirror transistor having a source electrode, a gate electrode, and a drain electrode and wherein the drain electrode is connected to the first node.

15. The circuit of claim 14, wherein the PMOS source follower comprises:
   a second node to connect to receive the first current source; and
   a PMOS transistor having a source electrode, a gate electrode, and a drain electrode, wherein the source electrode of the PMOS transistor is connected to the second node, the gate electrode is connected to the first node, and the drain electrode of the PMOS transistor is connected to a ground terminal.

16. The circuit of claim 15, wherein the NMOS source follower comprises:
   a third node; and
   a first NMOS transistor having a source electrode, a gate electrode, and a drain electrode, wherein the drain electrode of the first NMOS transistor to coupled to a supply voltage, wherein the gate electrode of the first NMOS transistor is connected to the second node, wherein the source of the first NMOS transistor is connected to the third node, and wherein the third node is connected to the gate electrode of the first mirror transistor, wherein the third node to connect to the ground terminal via a second current source.

17. The circuit of claim 16, wherein the output stage comprises:
   a second mirror transistor having a source electrode, a gate electrode, and a drain electrode, wherein the gate electrode of the second mirror transistor is connected to the third node, and wherein the source electrode of the second mirror transistor is connected to the ground terminal; and
   a second NMOS transistor having a source electrode, a drain electrode, and a gate electrode, wherein the drain electrode of the second NMOS transistor to couple to receive the output source current, wherein the gate electrode of the second NMOS transistor is connected to the replica circuit, and wherein the drain electrode of the second mirror transistor is connected to the source electrode of the second NMOS transistor.

18. The circuit of claim 17, wherein the first mirror transistor and the second mirror transistor are NMOS transistors.

19. The circuit of claim 18, wherein the replica circuit comprises:
   an input stage having a cascode biasing path connected to the gate electrode of the second NMOS transistor that receives an input current; and
   a pair of complementary source followers that is connected to the input stage of the replica circuit receives a first current source and a second current source, respectively.

20. A low voltage current mirror with a cascode biasing circuit comprising:
   an input stage that receives an input current, wherein the input stage has a first pair of mirror transistors;
   an output stage that provides an output current, wherein the output stage has a second pair of mirror transistors; and
   a pair of complementary source followers connected between the input stage and the output stage receives a first current source and a second current source, respectively, and establishes a bias voltage for the input stage and the output stage as a function of the input current that is independent of gate leakage of the input stage and the output stage.

21. The circuit of claim 20, wherein the input stage comprises:
   a first input node for receiving an input current, and wherein the first pair of mirror transistors comprises:
      a first input mirror transistor having a source electrode, a gate electrode, and a drain electrode, and wherein the drain electrode of the first input mirror transistor is connected to the first input node; and
      a first mirror transistor having a source electrode, a gate electrode, and a drain electrode, wherein the drain electrode of the first mirror transistor is connected to the source electrode of the first input mirror transistor, and wherein the source electrode of the first mirror transistor is connected to a ground terminal.

22. The circuit of claim 21, wherein the pair of complementary source followers comprises:
   a PMOS source follower; and
   an NMOS source follower connected to the PMOS source follower, wherein the PMOS source follower is connected to the input stage, and wherein the NMOS source follower is connected to the input stage and the output stage.

23. The circuit of claim 22, wherein the PMOS source follower comprises:
   a second node to couple to receive a first current source; and
   a PMOS transistor having a source electrode, a gate electrode, and a drain electrode, wherein the source electrode of the PMOS transistor is connected to the first current source via the second node, wherein the gate electrode of the PMOS transistor is connected to the first node, and wherein the drain electrode of the PMOS transistor is connected to the ground terminal.

24. The circuit of claim 23, wherein the NMOS source follower comprises:
   a third node to couple to receive a second current source; and
   an NMOS transistor having a source electrode, a gate electrode, and a drain electrode, wherein the source electrode of the NMOS transistor to connect to receive the second input source current, wherein the gate electrode of the NMOS transistor is connected to the second node, and wherein the drain electrode of the NMOS transistor to connect to receive the first input source current.

25. The circuit of claim 24, wherein in the output stage comprises:

a first output mirror transistor having a source electrode, a gate electrode, and a drain electrode, wherein the drain electrode of the first output mirror transistor is to connect to produce the output current, and wherein the gate electrode of the first output mirror transistor is connected to the gate electrode of the first input mirror transistor; and a second mirror transistor having a source electrode, a gate electrode, and a drain electrode, wherein the drain electrode of the second mirror transistor is connected to the source of the first output mirror transistor, wherein the gate electrode of the second mirror transistor and the gate electrode of the first mirror transistor is connected to the third node, and wherein the source of the second mirror transistor is to connect to the ground terminal.

26. The circuit of claim 25, wherein the first pair of mirror transistors and the second pair of mirror transistors are NMOS transistors.

27. The circuit of claim 22, wherein the low voltage current mirror with the cascode biasing circuit operates under a low bias gate voltage.

* * * * *